United States Patent
Sugihara et al.

(10) Patent No.: US 8,186,563 B2
(45) Date of Patent: May 29, 2012

(54) AUTOMATIC SOLDERING DEVICE AND CARRIER DEVICE

(75) Inventors: Takashi Sugihara, Tokyo (JP); Takashi Usuba, Saitama (JP); Hirokazu Ichikawa, Saitama (JP); Toshihiko Mutsuji, Tokyo (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 0 days.

(21) Appl. No.: 13/146,193

(22) PCT Filed: Jan. 26, 2010

(86) PCT No.: PCT/JP2010/050982
§ 371 (c)(1),
(2), (4) Date: Jul. 25, 2011

(87) PCT Pub. No.: WO2010/087342
PCT Pub. Date: Aug. 5, 2010

(65) Prior Publication Data
US 2011/0278348 A1    Nov. 17, 2011

(30) Foreign Application Priority Data
Jan. 27, 2009   (JP) .................................. 2009-015868

(51) Int. Cl.
*B23K 37/04* (2006.01)
(52) U.S. Cl. ............................. 228/37; 228/43; 228/49.5
(58) Field of Classification Search .................. None
See application file for complete search history.

(56) References Cited

U.S. PATENT DOCUMENTS
1,994,436 A * 3/1935 Przyborowski ................ 228/6.1
(Continued)

FOREIGN PATENT DOCUMENTS
JP          01117117        5/1989
(Continued)

OTHER PUBLICATIONS
International Search Report for PCT/JP2010/050982, Feb. 18, 2010.

*Primary Examiner* — Kiley Stoner
(74) *Attorney, Agent, or Firm* — Chernoff, Vilhauer, McClung & Stenzel (57) ABSTRACT

To enable the circuit board to be fixed on a predetermined position and to be conveyed to the solder processing portion. Conveying hooks 10 that hold the printed circuit board W1 therebetween, conveying chains 15a, 15b that drive so that the conveying hooks 10 are movable from a heater part 4 to a solder bath 5, first frames 9A that guide the conveying chains 15a, 15b along the heater part 4, second frames 9B that guide the conveying chain 15 along the solder bath 5, and an absorbing member 124 that is provided between each of the first frames 9A and each of the second frames 9B and absorbs an expansion and contraction based on difference of any thermal expansion between the frames 9A, 9B and the conveying chains 15a, 15b are provided. Since the absorbing member 124 absorbs the expansion and contraction based on difference of any thermal expansion between the frames 9A, 9B and the conveying chains 15a, 15b, it is possible to prevent the conveying chains 15a, 15b from being deviated from the frames 9A, 9B. This enables the printed circuit board W1 to be fixed on the predetermined position and to be conveyed to the heater part 4 and the solder bath 5.

5 Claims, 9 Drawing Sheets

U.S. PATENT DOCUMENTS

| | | | | |
|---|---|---|---|---|
| 2,772,416 A * | 12/1956 | Snow et al. | | 227/3 |
| 3,082,520 A * | 3/1963 | Hepner | | 228/180.1 |
| 3,179,237 A * | 4/1965 | Ninneman | | 53/313 |
| 3,286,817 A * | 11/1966 | Brigham | | 198/626.5 |
| 3,454,142 A * | 7/1969 | Holstein | | 198/626.1 |
| 3,605,244 A * | 9/1971 | Osborne et al. | | 8/180.1 |
| 3,726,007 A * | 4/1973 | Keller | | 29/840 |
| 3,848,864 A * | 11/1974 | Dwyer et al. | | 269/46 |
| 4,378,873 A * | 4/1983 | Cloudy | | 198/802 |
| 4,390,120 A * | 6/1983 | Broyer | | 228/180.1 |
| 4,454,834 A * | 6/1984 | Haas et al. | | 118/676 |
| 4,508,205 A * | 4/1985 | Aulagner et al. | | 198/323 |
| 4,570,785 A * | 2/1986 | Lewanski et al. | | 198/626.6 |
| 4,629,063 A * | 12/1986 | Hodlewsky et al. | | 198/853 |
| 4,695,482 A * | 9/1987 | Weiswurm | | 427/96.6 |
| 4,705,159 A * | 11/1987 | Feliks et al. | | 198/468.8 |
| 4,770,119 A * | 9/1988 | Kawamata et al. | | 118/503 |
| 4,874,081 A * | 10/1989 | Kondo | | 198/803.9 |
| 5,029,696 A * | 7/1991 | Van Tilburg | | 198/626.1 |
| 5,161,727 A * | 11/1992 | Leturmy et al. | | 228/37 |
| 5,320,271 A * | 6/1994 | Bell et al. | | 228/49.5 |
| 5,955,857 A * | 9/1999 | Kwon et al. | | 318/568.11 |
| 6,138,890 A * | 10/2000 | Kanno et al. | | 228/37 |
| 6,164,515 A * | 12/2000 | Andrus et al. | | 228/20.1 |
| 6,164,516 A * | 12/2000 | Watanabe et al. | | 228/37 |
| 6,168,065 B1 * | 1/2001 | Willemen | | 228/9 |
| 6,170,733 B1 * | 1/2001 | Fritz, Sr. | | 228/49.5 |
| 6,367,677 B1 * | 4/2002 | Hildenbrand et al. | | 228/9 |
| 6,443,355 B1 * | 9/2002 | Tsurusaki | | 228/222 |
| 6,688,511 B2 * | 2/2004 | Hildenbrand et al. | | 228/102 |
| 6,732,903 B2 * | 5/2004 | Wang et al. | | 228/37 |
| 6,910,613 B2 * | 6/2005 | Narita et al. | | 228/9 |
| 7,731,012 B2 * | 6/2010 | Santicchi | | 198/465.4 |
| 2004/0262127 A1 * | 12/2004 | Harnish et al. | | 198/459.8 |
| 2005/0106926 A1 * | 5/2005 | Liken et al. | | 439/377 |
| 2006/0043154 A1 * | 3/2006 | Kirby et al. | | 228/37 |
| 2011/0239665 A1 * | 10/2011 | Bilger et al. | | 62/64 |

FOREIGN PATENT DOCUMENTS

| | | | |
|---|---|---|---|
| JP | H0257812 | | 4/1990 |
| JP | H032375 | | 1/1991 |
| JP | H0581119 | | 11/1993 |
| JP | 07222346 | | 8/1995 |
| JP | 01-271060 A | * | 10/1999 |
| JP | 2002-356215 A | * | 10/2002 |

* cited by examiner

AUTOMATIC SOLDERING DEVICE AND CARRIER DEVICE

This is a national stage application filed under 35 USC 371 based on International Application No. PCT/JP2010/050982 filed Jan. 26, 2010, and claims priority under 35 USC 119 of Japanese Patent Application No. JP 2009-015868 filed Jan. 27, 2009.

TECHNICAL FIELD

The present invention relates to an automatic soldering apparatus and a conveying device, in which a printed circuit board or the like is conveyed to a solder processing portion to be soldered.

BACKGROUND ART

In general, the soldering of printed circuit board built in a consumer electrical appliance like a display device such as a television receiver or the like and a picture recording reproduction apparatus such as a video recorder has been often performed by a flow soldering to mass-produce the corresponding printed circuit boards at a reasonable price.

The flow soldering is a soldering method having a mass production property superior to other soldering because it can solder the whole surface of the printed circuit board at once. In an automatic soldering apparatus that performs the soldering using the flow soldering, various kinds of processing apparatuses such as a preheater, a solder bath, cooling device and the like have been provided. These processing apparatuses are provided with a conveying chain that conveys the printed circuit board and a conveying portion that has a frame guiding the conveying chain to the corresponding processing apparatuses. Such an automatic soldering apparatus performs preheating while the printed circuit board to which flux has been applied by a fluxer or the like is conveyed using the conveying chain, adheres solder thereon in a solder bath, and cools the printed circuit board by the cooling device so that the solder can be formed on a desired position of the printed circuit board.

Unless the solder is formed on a predetermined position of the printed circuit board with accuracy, solder bridge in which the solder is adhered to a position except for the predetermined position or insufficient solder in which no solder is adhered to the predetermined position occurs. Therefore, a conveying portion which fixes the printed circuit board securely on the predetermined position and conveys it is necessary for the automatic soldering apparatus.

Such automatic soldering apparatus, however, has a problem such that the conveying portion is heated because a preheating step by the preheater and a solder-adhering step by the solder bath are carried out and an expansion and contraction occurs based on difference of any thermal expansion between the chain and a frame which constitutes this conveying portion so that a position of the printed circuit board conveyed by the conveying portion is deviated from the predetermined position.

A patent document 1 discloses a conveying device for soldering which is provided with a cooling duct inside a frame. According to this conveying device for soldering, the cooling duct is provided in the frame and a cooling fluid such as air and water is supplied to this cooling duct and is passed therethrough. This can force the frame heated by the preheater and the solder bath to be cooled.

A patent document 2 discloses a conveying device for an automatic soldering, which is provided with a deviation absorption means for absorbing the deviation based on the expansion and contraction of the conveying portion. According to this conveying device for automatic soldering, a pair of frames provided outside of the solder processing apparatus, a supporting bar being put across the pair of frames, and the deviation absorption means that is provided between the supporting bar and the pair of frames and absorbs the deviation based on the expansion and contraction of the frame are provided. This can prevent any thermal distortion of the frame that is heated by the preheater and the solder bath.

PRIOR ART DOCUMENTS

Patent Document

Patent Document 1: Japanese Utility Model Publication No. H03-2375 (see FIG. 1).
Patent Document 2: Japanese Patent Application Publication No. H09-69681 (see FIG. 1).

DISCLOSURE OF THE INVENTION

Problems to be Solved by the Invention

By the way, in the patent document 1, it has a problem such that since the cooling fluid needs to be supplied to the cooling duct provided inside the frame in order to cool the frame, the costs increases in the conveying device for soldering. The patent document 2 merely absorbs the deviation based on the difference of thermal expansion between the frame and the supporting bar but does not take into consideration any expansion and contraction based on the difference of thermal expansion between the frame and the chain. Thus, it has a problem such that the circuit board cannot be securely fixed to the predetermined position and conveyed to a solder processing portion.

The invention, then, solves such problems and has an object of providing an automatic soldering apparatus and conveying device therefor which can fix the printed circuit board securely to the predetermined position and convey it to a soldering processing portion.

Means for Solving the Problems

The automatic soldering apparatus according to the invention is an automatic soldering apparatus comprising a heat treatment portion that performs a heat treatment on a circuit board at a predetermined temperature, a solder processing portion that performs solder processing on the circuit board on which a heat treatment is performed by the heat treatment portion and a conveying portion that conveys the circuit board from the heat treatment portion to the solder processing portion, characterized in that the conveying portion includes plural conveying hooks that hold the circuit board therebetween, conveying chains, each being provided with the conveying hooks, which drive so that the conveying hooks holding the circuit board therebetween are movable from the heat treatment portion to the solder processing portion, a pair of first frames that have a first sliding portion and guide the conveying chains slid by the first sliding portion along the heat treatment portion, a pair of second frames that have a second sliding portion that slides the conveying chains continuously transferred from the first sliding portion, are continuously provided to the first sliding portion and guide the conveying chains slid by the second sliding portion along the solder processing portion, and an absorbing member that is provided between each of the first frames and each of the second frames and absorbs an expansion and contraction based on difference of any thermal expansion between the first and second frames and the conveying chains.

Further, the conveying device according to the invention is characterized in that when a system which performs a first heat treatment on a conveyed object is set as a first heat treatment system and a system which performs a second heat treatment on the conveyed object on which the first heat treatment is performed by the first heat treatment system is set as a second heat treatment system, the device is provided with plural conveying hooks that hold the conveyed object therebetween, conveying chains, each being provided with the conveying hooks, which drive so that the conveying hooks holding the circuit board therebetween are movable from the first heat treatment system to the second heat treatment system, a pair of first frames that have a first sliding portion and guide the conveying chains slid by the first sliding portion along the first heat treatment system, a pair of second frames that have a second sliding portion that slides the conveying chains continuously transferred from the first sliding portion, are continuously provided to the first sliding portion and guide the conveying chains slid by the second sliding portion along the second heat treatment system, and an absorbing member that is provided between each of the first frames and each of the second frames and absorbs an expansion and contraction based on difference of any thermal expansion between the first and second frames and the conveying chains.

In the automatic soldering apparatus and the conveying device according to the invention, plural conveying hooks hold the circuit board therebetween. The conveying chains, each being provided with the conveying hooks, drive so that the conveying hooks holding the circuit board therebetween are movable from the heat treatment portion to the solder processing portion. A pair of first frames have a first sliding portion and guide the conveying chains slid by the first sliding portion along the heat treatment portion. A pair of second frames have a second sliding portion that slides the conveying chains continuously transferred from the first sliding portion, are continuously provided to the first sliding portion and guide the conveying chains slid by the second sliding portion along the solder processing portion. On the assumption of this, the absorbing member is provided between each of the first frames and each of the second frames and absorbs an expansion and contraction based on difference of any thermal expansion between the first and second frames and the conveying chains. This can prevent the conveying chains from being deviated from the first and second frames even when the first and second frames and the conveying chains are heated by heat generated at a time of heat treatment and solder processing.

EFFECTS OF THE INVENTION

By the automatic soldering apparatus and the conveying device according to the present invention, since the absorbing member which absorbs an expansion and contraction based on difference of any thermal expansion between the first and second frames and the conveying chains is provided between each of the first frames and each of the second frames, it is possible to prevent the conveying chains from being deviated from the first and second frames even when the first and second frames and the conveying chains are heated by the heat generated at a time of heat treatment and solder processing. This enables the circuit board to be fixed on the predetermined position and to be conveyed to the heat treatment portion and the solder processing portion. As a result thereof, it is capable of decreasing solder bridge in which the solder is adhered to a position except for the predetermined position or insufficient solder in which no solder is adhered to the predetermined position.

BEST MODE FOR CARRYING OUT THE INVENTION

The following will describe an embodiment of an automatic soldering apparatus according to the present invention with reference to drawings.

An automatic soldering apparatus 1 according to this embodiment is provided with heater parts 4 which are a heat treatment portion (first heat treatment system) that performs the heat treatment on a printed circuit board W1, which is a conveyed object, at a predetermined temperature; a solder bath 5 which is a solder processing portion (second heat treatment system) that performs solder processing on the printed circuit board W1 on which the heat treatment is performed by the heater parts 4; and a conveying portion 3 that conveys the printed circuit board W1 from the heater parts 4 to the solder bath 5.

The conveying portion 3 is provided with plural conveying hooks 10 that hold the printed circuit board W1 therebetween, conveying chains 15a, 15b, each being provided with the conveying hooks 10, which drive so that the conveying hooks 10 holding the printed circuit board W1 therebetween are movable from the heater parts 4 to the solder bath 5, a pair of first frames 9A that have a first sliding portion 91A and guide the conveying chains 15a, 15b slid by the first sliding portion 91A along the heater parts 4, a pair of second frames 9B that have a second sliding portion 91B that slides the conveying chains 15a, 15b continuously transferred from the first sliding portion 91A, are continuously provided to the first sliding portion 9A and guide the conveying chains 15a, 15b slid by the second sliding portion 9B along the solder bath 5, and an absorbing member 124 that is provided between each of the first frames 9A and each of the second frames 9B and absorbs an expansion and contraction based on difference of any thermal expansion between the first and second frames 9A, 9B and the conveying chains 15a, 15b.

On the assumption of this, the absorbing member 124 is provided between each of the first frames 9A and each of the second frames 9B and absorbs an expansion and contraction based on difference of any thermal expansion between the first and second frames 9A, 9B and the conveying chains 15a, 15b. This can prevent the conveying chains 15a, 15b from being deviated from the first and second frames 9A, 9B, even if the first and second frames 9A, 9B and the conveying chains 15a, 15b are heated by heat generated at a time of processing in the heater parts 4 and the solder bath 5. Therefore, it is possible to convey the printed circuit board W1 to the heater parts 4 and the solder bath 5 with it being fixed on a predetermined position. As a result thereof, it is capable of decreasing solder bridge in which the solder is adhered to a position except for the predetermined position or insufficient solder in which no solder is adhered to the predetermined position.

[Configuration Example of Automatic Soldering Apparatus 1]

Figure 1:
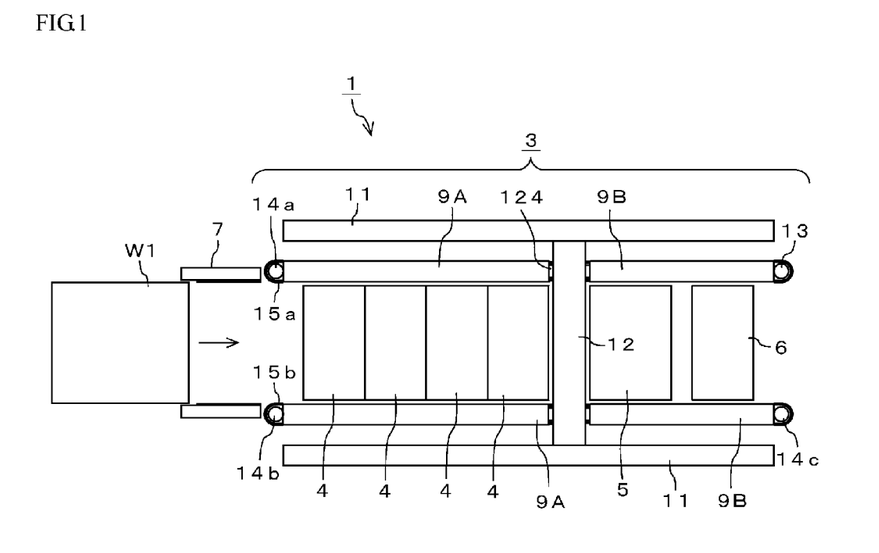
FIG. 1 is a plan view of an automatic soldering apparatus 1 according to this embodiment for showing a configuration example thereof.
Figure 2:
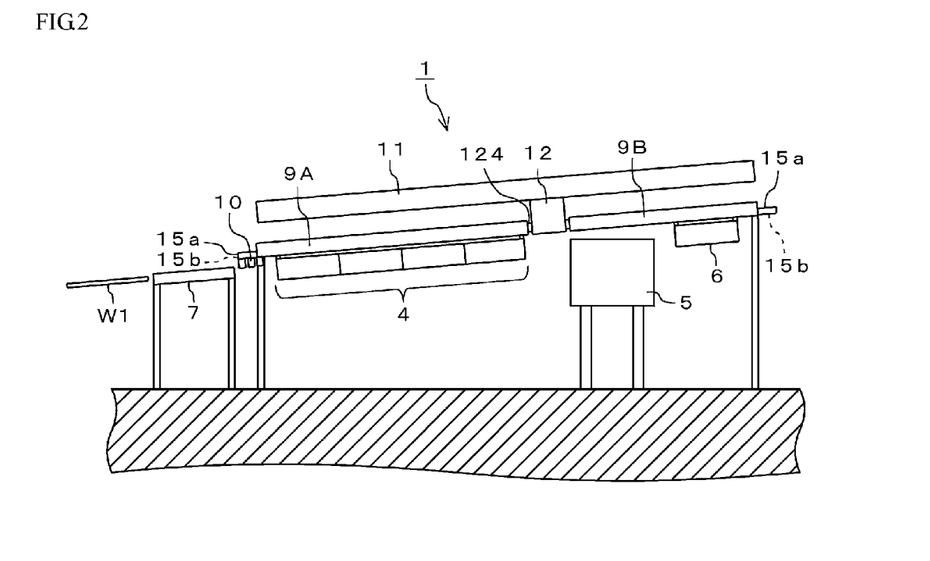
FIG. 2 is a front view of the automatic soldering apparatus 1 for showing a configuration example thereof.

First, the following will describe a configuration example of the automatic soldering apparatus 1 according to this embodiment. As shown in FIGS. 1 and 2, the automatic soldering apparatus 1 is constituted of the heater parts 4 that perform the heat treatment on the printed circuit board W1 at a predetermined temperature, the solder bath 5 that performs solder processing on the printed circuit board W1 on which the heat treatment is performed by the heater parts 4, and the conveying portion 3 which is a conveying device that conveys the printed circuit board W1 from the heater parts 4 to the solder bath 5. Further, the automatic soldering apparatus 1 is provided with a carrying portion 7 that carries the printed circuit board W1 into the conveying portion 3 and a cooling portion 6 that cools the printed circuit board W1 on which the solder is adhered in the solder bath 5.

The heater parts 4 allow to dry out the printed circuit board W1 onto which flux is applied in a fluxing step which is a step before the corresponding printed circuit board W1 is inserted into the automatic soldering apparatus 1 and heats the corresponding printed circuit board W1 in order to improve adherence of the solder, which is such a degree that the solder is adhered to the printed circuit board W1 when performing the soldering in the solder bath 5 to be described later. The heater parts 4 are arranged at, for example, a vertical direction of the printed circuit board W1 thus conveyed and four ones are arranged in a line along a conveying direction of the printed circuit board W1, each of the heater parts 4 being temperature-adjustable.

The solder bath 5 is provided so that it is adjacent to the heater parts 4. Molted solder is contained in the solder bath 5. The molted solder is, for example, lead-free solder and is constituted of tin-silver-copper, tin-zinc-bismuth or the like, which has a melting point of about 180° C. through 220° C. The solder bath 5 is operated so that the molten solder is jetted toward the printed circuit board W1 thus conveyed at uniform level.

The cooling portion 6 is provided so that it is adjacent to the solder bath 5. The cooling portion 6 sends air blast to the printed circuit board W1 by a fan, not shown, which constitutes the corresponding cooling portion 6 and cools the printed circuit board W1 which has been heated by the heater parts 4 and the solder bath 5. By cooling the printed circuit board W1 by the cooling portion 6, it is possible to prevent a crack or the like from occurring in the solder applied to the printed circuit board W1.

[Configuration Example of Carrying Portion 7]

Figure 3:
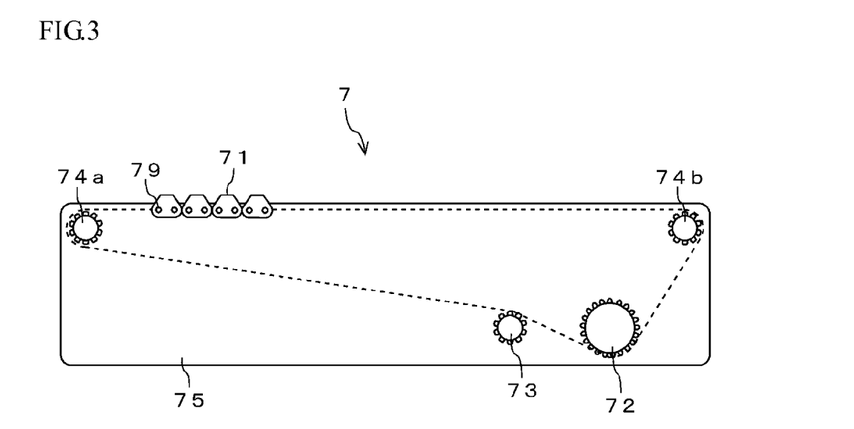
FIG. 3 is a front view of carrying portion 7 for showing a configuration example thereof.

Next, the following will describe a configuration example of the carrying portion 7. As shown in FIG. 3, the carrying portion 7 is provided with flanged chains 71, a driving gear 72, a tension adjustment gear 73, fixed gears 74a, 74b and a fixed plate 75. the carrying portion 7 has a function to carry the printed circuit board W1 to the conveying portion 3.

The driving gear 72 and the fixed gears 74a, 74b are fixed on the fixed plate 75. The flanged chains 71 are wound around the driving gear 72 and the fixed gears 74a, 74b. The tension adjustment gear 73 is provided on the fixed plate 75 so as to be movable vertically and the corresponding tension adjustment gear 73 adjusts the tension of the flanged chains 71 by moving itself vertically, For example, the tension adjustment gear 73 makes tensile force applied to the flanged chains 71 strong by moving upward with it being attached to the flanged chains 71. The tension adjustment gear 73 makes tensile force applied to the flanged chains 71 weak by moving downward.

To the driving gear 72, a motor, not shown, is connected and by driving the motor, the driving gear rotates. The driving gear 72 rotates and then, the fixed gears 74a, 74b connected with the flanged chains 71 also rotate. The printed circuit board W1 is carried into the conveying portion 3 while a bottom surface of the corresponding printed circuit board W1 is attached onto pins 79 constituting the flanged chains 71.

Figure 4:
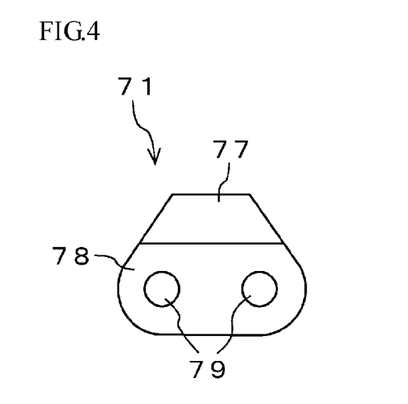
FIG. 4 is a front view of a flanged chain 71 for showing a configuration example thereof.
Figure 5:
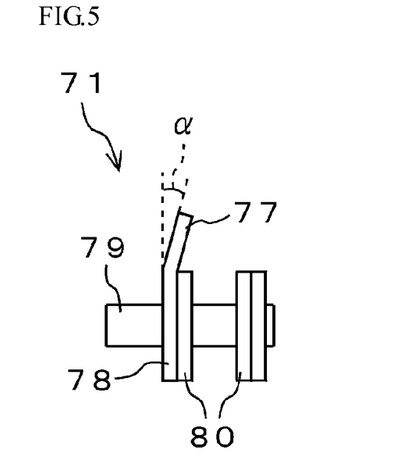
FIG. 5 is a right side view of the flanged chain 71 for showing a configuration example thereof.

As shown in FIGS. 4 and 5, each of the flanged chains 71 is constituted of a flange 77, a plate 78, the pins 79 and chain main body portion 80. The flange 77 is provided on the plate 78. The plate 78 and the chain main body portion 80 are fixed to each other by the pins 79. The flange 77 is formed so as to slant by an angle α against the plate 78. Since the flange 77 slants outward on the basis of a carrying direction of the printed circuit board W1, it is easy to put the printed circuit board W1 onto the carrying portion 7.

The flux may adhere the flanged chains 71 via the printed circuit board W1 in a flux-application step which is a previous step. If the chain is a normal chain without any flange, a large amount of the flux is adhered to side walls 76 of the carrying portion 7 shown in FIG. 10. As a result thereof, the side walls 76 slip on the pins constituting the chain so that it is difficult to carry the corresponding printed circuit board W1 to the conveying portion 3. Further, it is necessary to perform a cleanup thereof frequently in order to allow a slide on the pins to be dissolved.

Figure 10:
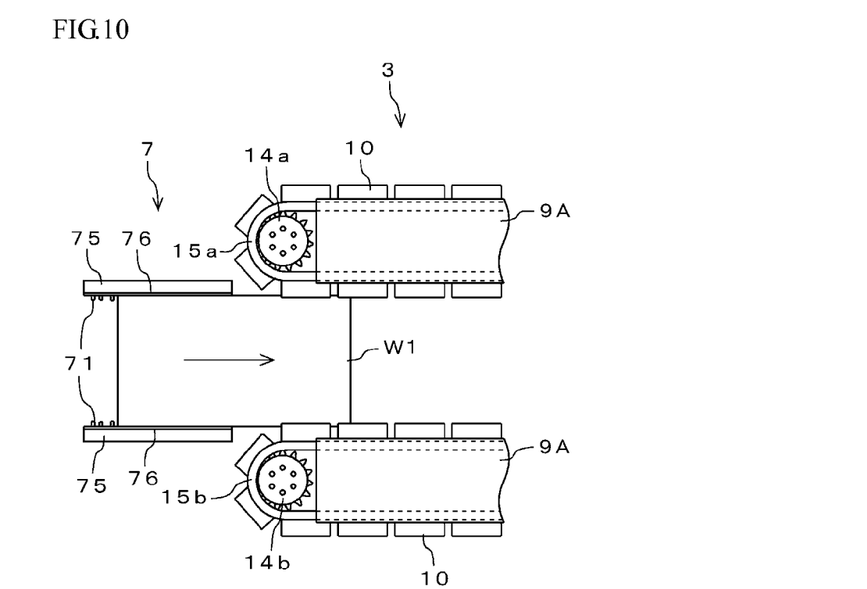
FIG. 10 is a plan view for showing the configuration example and the operation example of important portions in the carrying portion 7 and the conveying portion 3.

Since the flux is adhered to the flange 77, by proving the flanged chains 71 according to the present invention in the carrying portion 7, it is capable of substantially decreasing an amount of flux adhered to the side walls 76 of the carrying portion 7. Even if a large amount of flux is adhered onto the flange 77 of the flanged chains 71, it is possible to carry the printed circuit board W1 securely to the conveying portion 3 because the flange 77 moves together with the printed circuit board W1 by the flanged chains 71. It is also possible to decrease the frequency of cleaning up the flanged chains 71 and the side walls 76 of the carrying portion 7.

<Configuration Example of Conveying Portion 3>

Next, the following will describe a configuration example of the conveying portion 3. As shown in FIGS. 1 and 2, the conveying portion 3 is constituted of the conveying chains 15a, 15b, the conveying hooks 10, the first frame (hereinafter, referred to as "frame 9A"), the second frame (hereinafter, referred to as "frame 9B") and the absorbing member 124. The conveying portion 3 is further provided with reinforcing frames 11, frame supporting portions 12, a fixation/fixation-releasing portion 13 and conveying gears 14a, 14b and 14c. The conveying portion 3 has a function to convey the printed circuit board W1 carried by the carrying portion 7 from the heater parts 4 to the cooling portion 6 through the solder bath 5.

The conveying chains 15a, 15b respectively wind around the conveying gear 14a and the fixation/fixation-releasing portion 13 as well as the conveying gear 14b and the conveying gear 14c. The conveying hooks 10 are fitted to the conveying chains 15a, 15b which drive so that the conveying hooks 10 are movable from the heater parts 4 to the cooling portion 6 through the solder bath 5. The conveying chains 15a, 15b are formed of iron, its alloy or the like.

Figure 6:
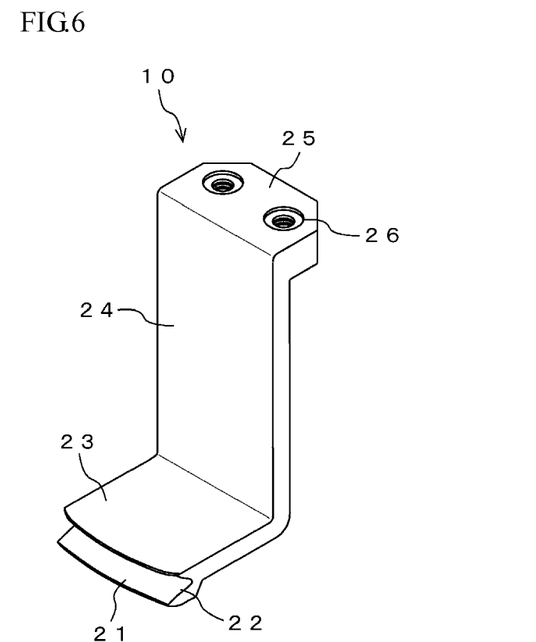
FIG. 6 is a perspective view of a conveying hook 10 for showing a configuration example thereof.

As shown in FIG. 6, each conveying hook 10 is constituted of a hook main body 21, a projection portion 23, a hook supporting portion 24 and a flange portion 25. The conveying hooks 10 are hooks for conveying the printed circuit board W1 and allowing it to be soldered and hooks for conveying the printed circuit board W1 to the heater parts 4, the solder bath 5 and the cooling portion 6 with both right and left ends thereof being held therebetween.

The conveying hooks 10 are made of heat-resistant plastic such as liquid crystal polymer or the like, and are produced with a metal mold so as to be about L shaped plate. The flange portion 25 extending to a right direction is formed on the upper portion of each conveying portion 10 as shown in FIG. 6. A pair of metal female screws 26 are filled in this flange portion 25. The conveying hooks 10 are installed and fixed to the conveying chains 15a, 15b using these female screws 26. Since the conveying hooks installed to the conveying chains 15a, 15b have narrow space between their hooks, it is possible to hold the corresponding printed circuit board W1 securely even if the printed circuit board W1 is bent.

Figure 7:
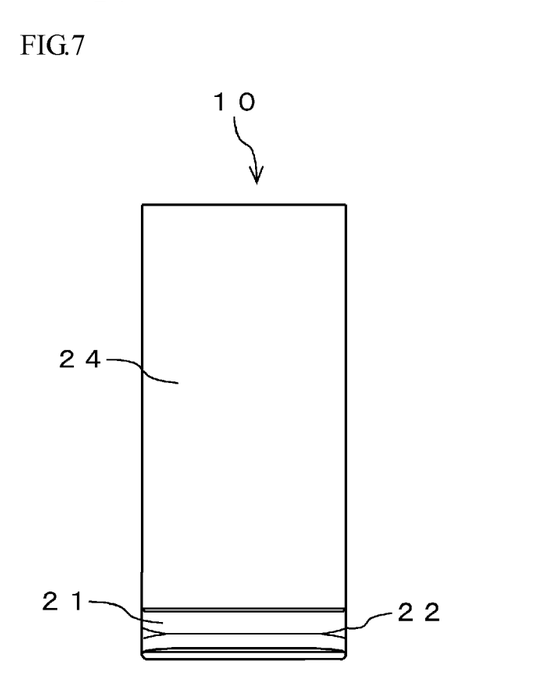
FIG. 7 is a front view of the conveying hook 10 for showing the configuration example thereof.
Figure 8:
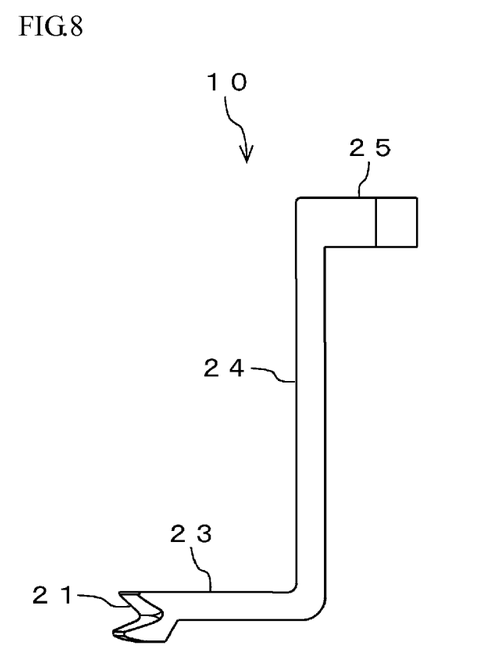
FIG. 8 is a right side view of the conveying hook 10 for showing the configuration example thereof.

The flange portion 25 is provided with the hook supporting portion 24. The hook supporting portion 24 extends downward from the flange portion 25. The hook supporting portion 24 is provided with the hook main body 21 via the projection portion 23. The hook main body 21 has an opening portion like a letter of V and as shown in FIG. 7, right and left ends of the hook main body 21 are made open wider than a middle portion thereof. In each conveying hook 10, as shown in FIG. 8, a lower forward end surface thereof projects forward somewhat against an upper forward end surface thereof. This is because it is easy to hold the printed circuit board W1 therebetween. Forming the conveying hook so as to be L-shape and providing with the projection portion 23 are because there is a component such as a connector which are fitted to the printed circuit board W1 with it being projected from the ends of the printed circuit board W1 in the component mounted on the printed circuit board W1 and this component is not interfered with the conveying hook 10.

Figure 9:
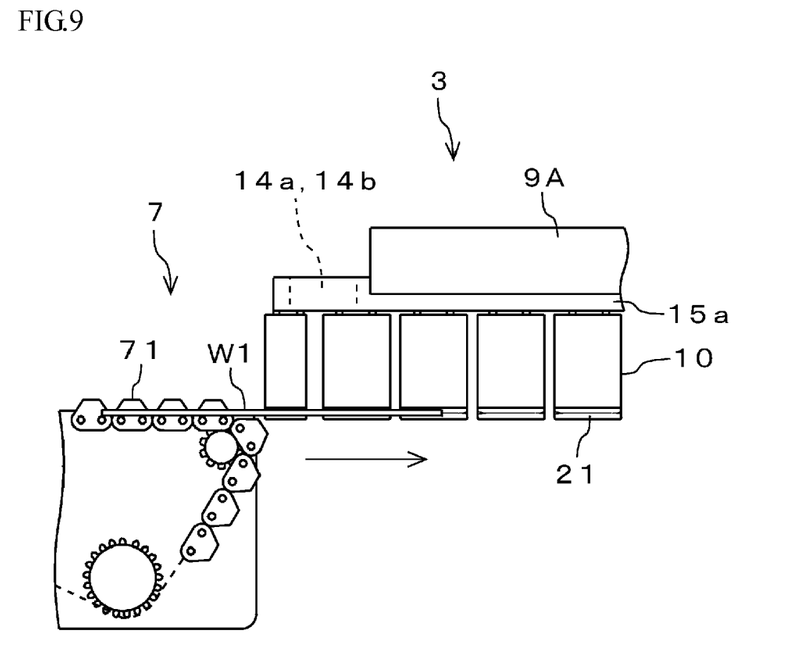
FIG. 9 is a front view for showing a configuration example and an operation example of important portions in the carrying portion 7 and the conveying portion 3.

As shown in FIGS. 9 and 10, the carrying portion 7 carries the printed circuit board W1 to the conveying portion 3 by the flanged chains 71. As described above, the conveying gears 14a, 14b constituting the conveying portion 3 are wound by the conveying chains 15a, 15b and the conveying hooks 10 are fitted to the conveying chains 15a, 15b.

The conveying gears 14a, 14b rotate and the hook main bodies 21 that the conveying hooks 10 have hold ends of the printed circuit board W1 carried from the carrying portion 7 into the conveying portion 3 therebetween. Since both of the right and left ends of each hook main body 21 is made open wider than the middle portion thereof, the conveying hooks 10 can hold the printed circuit board W1 carried from the carrying portion 7 therebetween securely even if a height of the flanged chains 71 and height of the printed circuit board W1 are out of alignment somewhat. Thereby, the conveying hooks 10 according to the invention may decrease holding mistakes of the printed circuit board W1 and hold the printed circuit board W1 therebetween securely.

It is to be noted that in this embodiment, the conveying hooks 10 each having L-shape providing the projection portion 23 have been described, they may be of straight shape without providing with projection portion 23 if no component is installed on the printed circuit board W1 with it being projected from the end thereof. This allows the printed circuit board W1 having a wider board width to be held therebetween.

Figure 11:
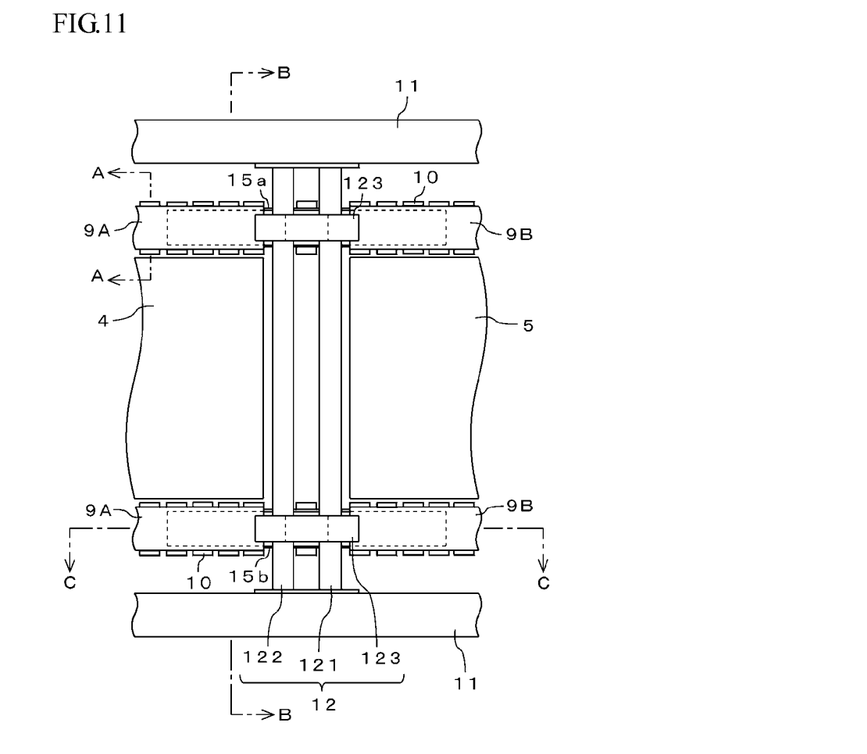
FIG. 11 is a plan view of a frame joint portion for showing a configuration example of important portions thereof.
Figure 12:
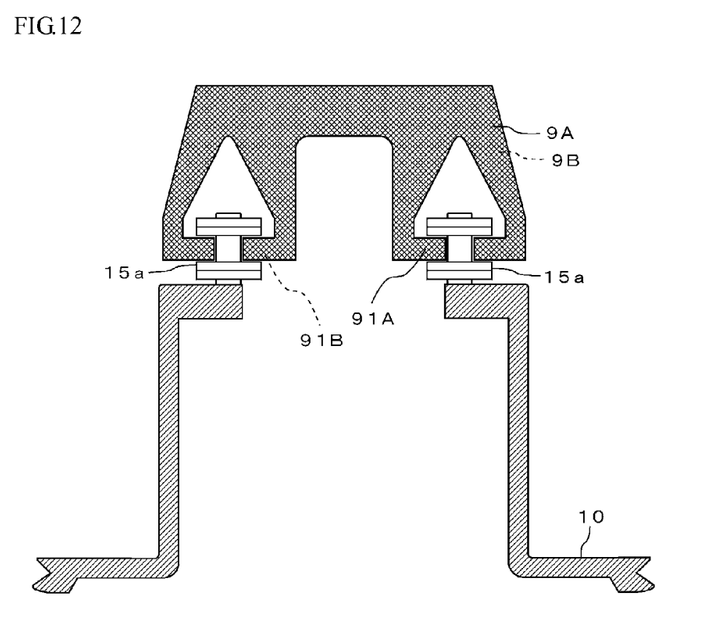
FIG. 12 is a sectional view for showing a relationship example between frame 9A and conveying chain 15a, taken along lines A-A shown in FIG. 11.

As shown in FIG. 11, the frame guiding the conveying chains 15a, 15b to the heater parts 4 and the solder bath 5 is partitioned into the frame 9A and the frame 9B. The frame 9A has a first sliding portion (hereinafter, referred to as "sliding portion 91A") and guides the conveying chains 15a, 15b slid by the corresponding sliding portion 91A along the heater parts 4. The frame 9B has a second sliding portion (hereinafter, referred to as "sliding portion 91B") sliding the conveying chains 15a, 15b continuously transferred from the sliding portion 91A, is continuously provided to the frame 9A and guides the conveying chains 15a, 15b slid by the corresponding sliding portion 91B along the solder bath 5.

The frames 9A, 9B are formed by aluminum or the like. It is preferable to partition the frame into the frames 9A, 9B between the heater parts 4 and the solder portion 5. This is because, in heat generated in the automatic soldering apparatus 1, heat generated from the solder bath 5 is largest so that the frames 9A, 9B and the conveying chains 15a, 15b near the solder bath 5 distort largely based on their thermal expansion.

Figure 13:
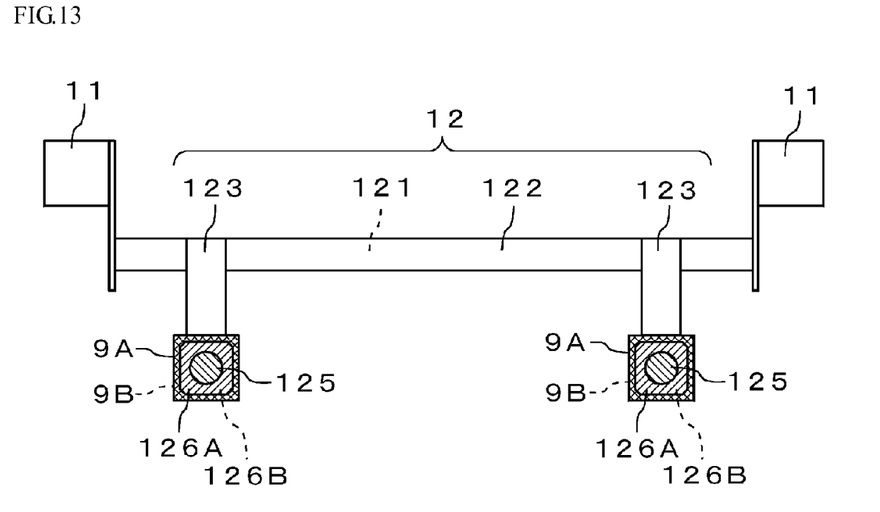
FIG. 13 is a sectional view for showing a relationship example between a pair of frames 9A, 9B, taken along lines B-B shown in FIG. 11.

As shown in FIGS. 11 and 13, a frame supporting portion 12 for supporting the frames 9A and 9B is provided between the frame 9A and the frame 9B. On the frame supporting portion 12, a pair of reinforcement frames 11 are provided. The reinforcement frames 11 are formed by aluminum or the like and reinforce the frames 9A, 9B to improve their strengths. The frame supporting portion 12 is constituted of a frame supporting shaft 121, a board width adjustment shaft 122 and shaft supporting portions 123.

The frame supporting shaft 121 and the board width adjustment shaft 122 are arranged almost in parallel with each other and fixed by the shaft supporting portions 123. The frame supporting shaft 121 fixes the pair of the frames 9A and 9B and the pair of the reinforcement frames 11. The shaft supporting portions 123 fixes fix the frames 9A and 9B via the absorbing member 124, which will be described later in FIGS. 14A and 14B. The board width adjustment shaft 122 is connected with a board width adjustment handle, not shown, which is provided at a predetermined portion in the automatic soldering apparatus 1 when adjusting board width of the printed circuit board W1. When rotating the board width adjustment handle, the board width adjustment shaft 122 connected with the board width adjustment handle rotates so that the frames 9A, 9B move in a board width direction. This allows a conveying width of the conveying portion 3 conveying the printed circuit board W1 to be adjusted so as to meet the width of the printed circuit board W1.

Figure 14A:
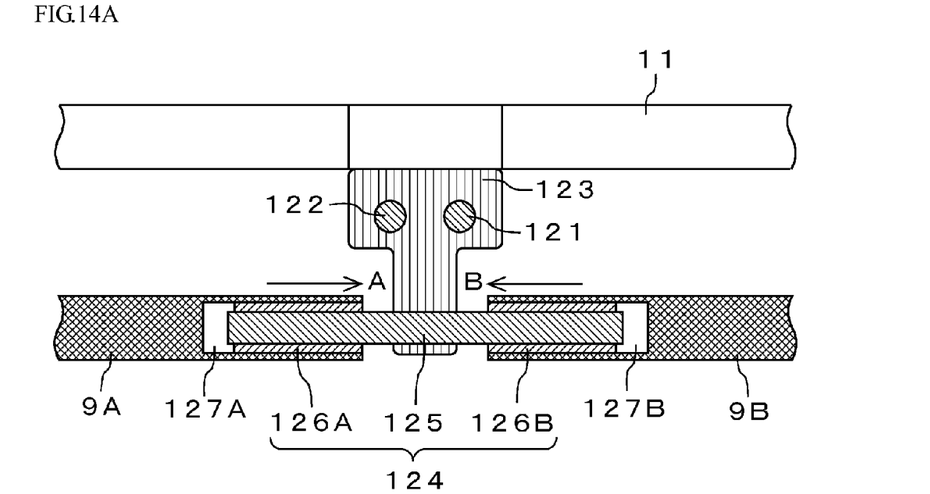
FIG. 14A is a sectional view for showing a joint example between the frame 9A and the frame 9B, taken along lines C-C shown in FIG. 11.

As shown in FIG. 14A, the absorbing member 124 is provided between the frame 9A and the frame 9B. The absorbing member 124 stands between the heater parts 4 and the solder bath 5. The absorbing member 124 is constituted of an absorbing shaft 125 and absorbing bushings 126A, 126B. The absorbing shaft 125 is fixed on each shaft supporting portion 123, is provided with the absorbing bushing 126A at one portion thereof and is provided with the absorbing bushing 126B at the other portion thereof, and is inserted into the absorbing bushings 126A, 126B. The absorbing bushings 126A, 126B are respectively fixed on the frames 9A, 9B. The absorbing shaft 125 is formed by iron or the like and the absorbing bushings 126A, 126B are formed by brass or the like. The reason why they are formed by different kinds of metals is that the absorbing shaft 125 inserted into the absorbing bushings 126A, 126B is made easy to slide relatively and allows absorbing bushings 126A, 126B to have a function as cushioning material between the frames 9A, 9B and the absorbing shaft 125. This is not limited to a combination of the iron (absorbing shaft 125) and the brass (absorbing bushings 126A, 126B) according to this embodiment if material meets this purpose.

There is a space 127A between an end of the absorbing member 124 and the frame 9A and there is also a space 127B between the other end of the absorbing member 124 and the frame 9B. As described above, since the frames 9A, 9B are formed by aluminum and the conveying chains 15a, 15b fixed at predetermined positions in the frames 9A, 9B are formed by iron, the coefficient of thermal expansion of the frames 9A, 9B becomes larger than the coefficient of thermal expansion of the conveying chains 15a, 15b. If the frames 9A, 9B and the conveying chains 15a, 15b are heated by the heat generated by preheating of the printed circuit board W1 with the heater parts 4 and soldering of the printed circuit board W1 by the solder bath 5, the frames 9A, 9B expand more than the conveying chains 15a, 15b.

Figure 14B:
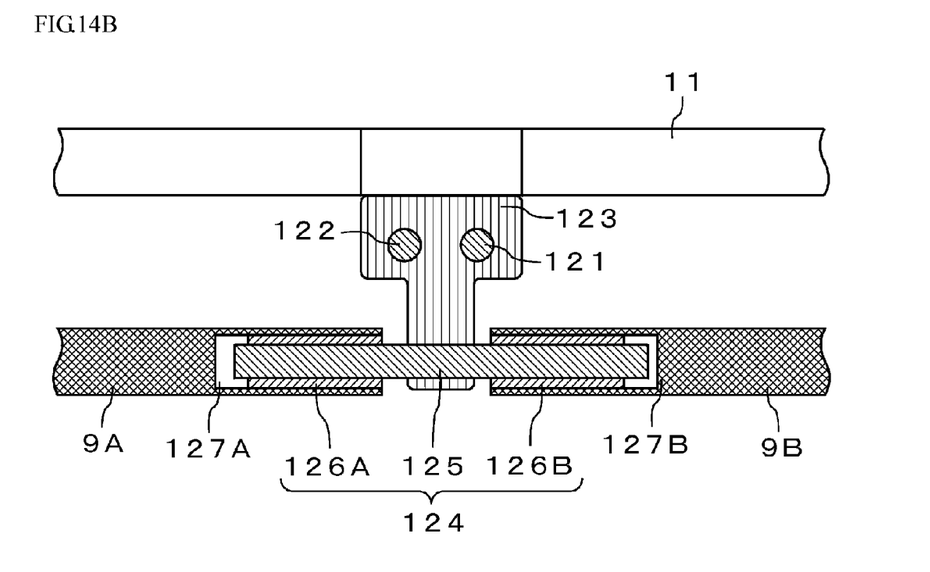
FIG. 14B is a sectional view for showing an expansion of the frames 9A and 9B, when heating, in FIG. 14A.

If the frame is not partitioned like frames 9A, 9B, positions of the conveying chains 15a, 15b become unstable by the expansion of the above-mentioned frames, so that it is possible to fail to fix the printed circuit board W1 on a predetermined position or to cut the conveying chains 15a, 15b. However, by partitioning the frame into two parts such as frames 9A, 9B, providing the absorbing member therebetween, and providing spaces 127A, 127B between both ends of the absorbing member 124 and the frames 9A, 9B, it is possible to absorb an expansion and contraction based on difference of any thermal expansion between the frames 9A, 9B and the conveying chains 15a, 15b. Namely, even if the frames 9A, 9B extend respectively along the direction of an arrow A shown in FIG. 14A and the direction of an arrow B shown therein by heating as shown in FIG. 14B, the frames 9A, 9B can expand as the guide by the absorbing shaft 125 via the absorbing bushings 126A, 126B independently of the extension of the conveying chains 15a, 15b and without having any impact on the conveying chains 15a, 15b.

Thereby, it is possible to prevent the conveying chains 15a, 15b from being deviated from the first and second frames 9A, 9B even if the frames 9A, 9B and the conveying chains 15a, 15b are heated by the heat generated in processing of the heater parts 4 and the solder bath 5. As a result thereof, it is possible to convey the printed circuit board W1 to the heater parts 4 and the solder bath 5 with it being fixed to the predetermined position.

It is also possible to prevent the conveying portion 3 from being destroyed by the expansion and contraction based on difference of any thermal expansion between the frames 9A, 9B and the conveying chains 15a, 15b. Further, because it is possible to prevent the conveying portion 3 from being destroyed, a length of the conveying portion 3 can be made longer so that by making the length of the heater parts 4 longer, the printed circuit board W1 can be sufficiently heated. This allows adhesive power of the solder, which enables the solder to be adhered on the printed circuit board W1, to be improved, and as a result thereof, enables improvement in quality to be satisfied.

Figure 15A:
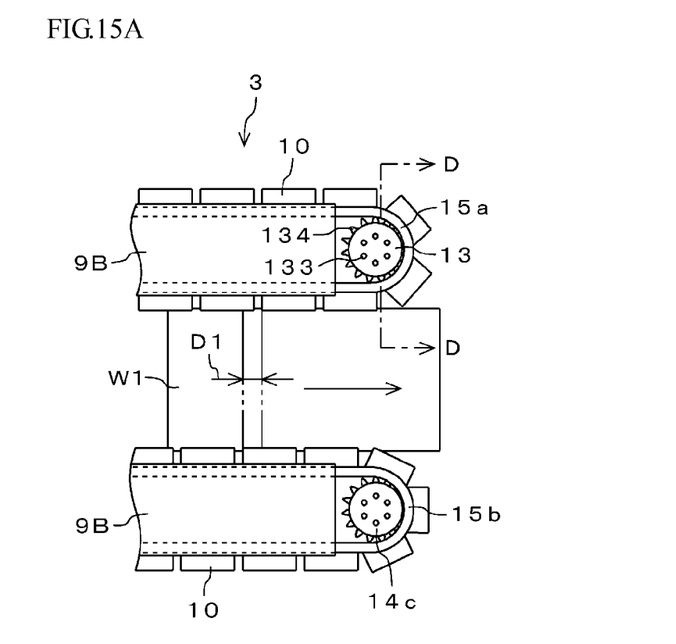
FIG. 15A is a plan view for showing a configuration example and an operation example of important portions in the other end of the conveying portion 3 when the opposed conveying hooks 10 are out of alignment with each other.
Figure 15B:
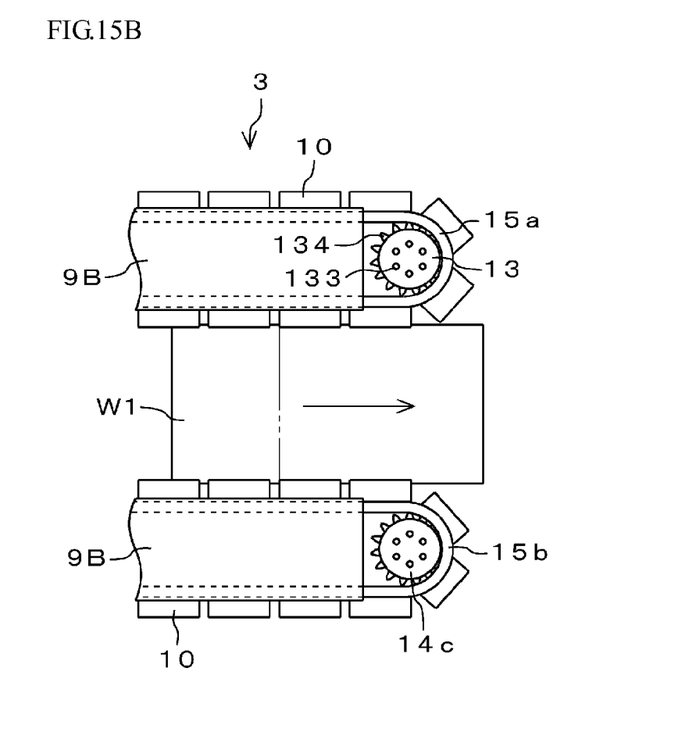
FIG. 15B is a plan view for showing a configuration example and an operation example of important portions in the other end of the conveying portion 3 when the opposed conveying hooks 10 are aligned.

As shown in FIG. 15A, if the conveying hooks 10 respectively provided on frames 9B which are opposed to each other are out of alignment by D1, the printed circuit board W1 may be deviated from the predetermined position when conveying the corresponding printed circuit board W1. Therefore, as shown in FIG. 15B, it is desirable to meet the positions of the opposed conveying hooks 10 to each other.

As in the past, in order to meet the positions of the conveying hooks 10 to each other, the other end of conveying portion 3 around the conveying gear 14c has been disassembled and then, their positions have been adjusted. However, such method has been required much time and effort. Thus, in this invention, a fixation/fixation-releasing portion 13 is provided at the other end of the conveying portion 3 in which as in the past, the conveying gear has been provided. This enables time and effort required for the operation of dis-assembly of the other end of conveying portion 3 when adjusting the positions of the conveying hooks 10 to be dissolved.

Figure 16:
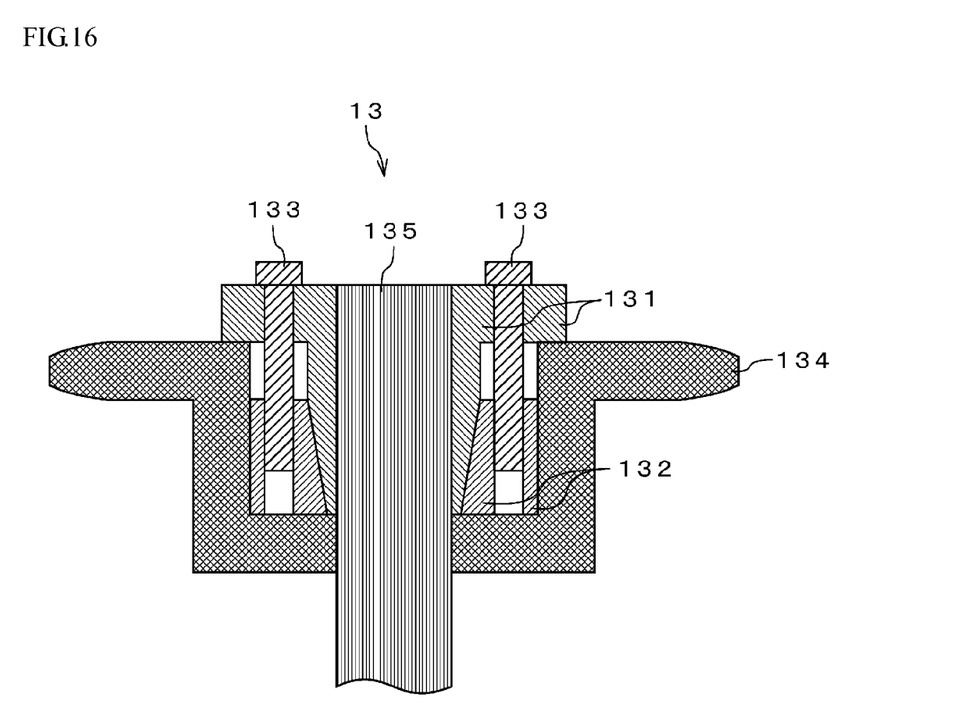
FIG. 16 is a sectional view of a fixation/fixation-releasing portion 13 for showing a configuration example thereof, taken along lines D-D shown in FIG. 15A.

As shown in FIG. 16, the fixation/fixation-releasing portion 13 has a mechanical lock mechanism that is constituted of an inner ring 131, an outer ring 132, bolts 133 and a sprocket 134. The mechanical lock mechanism is operated such that when fastening the bolts 133, the inner ring 131 and the outer ring 132 are fixed and when loosening the bolts 33, the fixation of the inner ring 131 and the outer ring 132 are released.

The inner ring 131 and the outer ring 132 taper so that they are contacted to each other. When fastening the bolts 133, the inner ring 131 moves downward and the outer ring 132 moves upward so that a chain coupling shaft 135 and the sprocket 134 are fixed. The chain coupling shaft 135 is connected with the conveying chain 15b located at a side of the conveying gear 14c. The sprocket 134 is wound around the conveying chain 15a. Therefore, when fastening the bolts 133, the conveying chain 15a and the conveying chain 15b are connected to each other.

When loosing the bolts 133, the inner ring 131 moves upward and the outer ring 132 moves downward so that fixation of the chain coupling shaft 135 and the sprocket 134 are released. In other words, when loosing the bolts 133, fixation of the conveying chain 15a and the conveying chain 15b are released. Since the fixation/fixation-releasing portion 13 is connected to the wound conveying chain 15a, so that by rotating the fixation/fixation-releasing portion 13, it is possible to adjust the positions of the conveying hooks 10.

This enables the positions of the conveying hooks 10 to be easily adjusted merely by fastening the bolts 133 which the fixation/fixation-releasing portion 13 has or releasing the fastening of the bolts 133 without disassembling the other end of the conveying portion 3. In order to adjust the positions of the conveying hooks 10 more accurately, it is preferable to perform an adjustment operation after by rotating the above-mentioned board width adjustment handle, a distance between the opposed frames 9B is made smallest. It is to be noted that although the fixation/fixation-releasing portion 13 has been provided on the conveying gear that is positioned at a right upper side of FIG. 1 in this embodiment, it may be provided instead of the conveying gear 14a, 14b, and 14c.

Thus, in the automatic soldering apparatus 1 according to this embodiment, the conveying portion 3 includes plural conveying hooks 10 that hold the printed circuit board W1 therebetween, conveying chains 15a, 15b, each being provided with the conveying hooks 10, which drive so that the conveying hooks 10 holding the printed circuit board W1 therebetween are movable from the heater parts 4 to the solder bath 5, a pair of first frames 9A that have a sliding portion 91A and guide the conveying chains 15a, 15b slid by the corresponding sliding portion 91A along the heater parts 4, a pair of second frames 9B that have a sliding portion 91B that slides the conveying chains 15a, 15b continuously transferred from the sliding portion 91A, are continuously provided to the first sliding portion 9A and guide the conveying chains 15a, 15b slid by the sliding portion 91B along the solder bath 5, and an absorbing member 124 that is provided between each of the first frames 9A and each of the second frames 9B and absorbs an expansion and contraction based on difference of any thermal expansion between the first and second frames 9A, 9B and the conveying chains 15a, 15b.

Thus, since the absorbing member 124 that absorbs the expansion and contraction based on difference of any thermal expansion between the frames 9A, 9B and the conveying chains 15a, 15b is provided between each of the frames 9A and each of the frames 9B, it is possible to prevent the conveying chains 15a, 15b from being deviated from the first and second frames 9A, 9B even if the frames 9A, 9B and the conveying chains 15a, 15b are heated by the heat generated in processing of the heater parts 4 and the solder bath 5. As a result thereof, it is possible to convey the printed circuit board W1 to the heater parts 4 and the solder bath 5 with it being fixed to the predetermined position securely. Further, since merely the absorbing member 124 is provided between each of the frames 9A and each of the frames 9B, any manufacturing costs for manufacturing the automatic soldering apparatus may be reduced.

It is to be noted that although, in this embodiment, the frame has been partitioned into two parts and the absorbing member 124 is positioned between these partitioned frames, the frame may be partitioned into three parts or more and the absorbing members 124 may be positioned between these partitioned frames. This enables an expansion and contraction based on difference of any thermal expansion between the frames and the conveying chains 15a, 15b to be more absorbed so that it is possible to convey the printed circuit board W1 to the heater parts 4 and the solder bath 5 securely unless the conveying chains 15a, 15b are deviated from the predetermined position.

INDUSTRIAL APPLICABILITY

It is very preferable that this invention is applied to an automatic soldering apparatus and a conveying device, in which a printed circuit board or the like is conveyed to a solder processing portion to be soldered.

DESCRIPTION OF CODES

1 . . . Automatic Soldering Apparatus; 3 . . . Conveying Portion (Conveying Device); 4 . . . Heater Parts; 5 . . . Solder Bath; 6 . . . Cooling Portion; 7 . . . Carrying Portion; 9A . . . First Frame; 9B . . . Second Frame; 10 . . . Conveying Hooks; 11 . . . Reinforcement Frames; 12 . . . Frame Supporting Portion; 13 . . . Fixation/Fixation-releasing Portion; 14a, 14b, 14c . . . Conveying Gears; 15a, 15b . . . Conveying Chains; 71 . . . Flanged Chains; 91A . . . First Sliding Portion; 91B . . . Second Sliding Portion; 124 . . . Absorbing Member; and W1 . . . Printed Circuit Board.

The invention claimed is:

1. An automatic soldering apparatus comprising a heat treatment portion that performs a heat treatment on a circuit board at a predetermined temperature,
  a solder processing portion that performs solder processing on the circuit board on which a heat treatment is performed by the heat treatment portion, and
  a conveying portion that conveys the circuit board from the heat treatment portion to the solder processing portion, wherein
  the conveying portion includes:
  plural conveying hooks that hold the circuit board therebetween;
  conveying chains, each being provided with the conveying hooks, which drive so that the conveying hooks holding the circuit board therebetween are movable from the heat treatment portion to the solder processing portion;
  a pair of first frames that have a first sliding portion and guide the conveying chains slid by the first sliding portion along the heat treatment portion;
  a pair of second frames that have a second sliding portion that slides the conveying chains continuously transferred from the first sliding portion, are continuously provided to the first sliding portion and guide the conveying chains slid by the second sliding portion along the solder processing portion; and
  an absorbing member that is provided between each of the first frames and each of the second frames and absorbs an expansion and contraction based on difference of any thermal expansion between the first and second frames and the conveying chains chains,
  and wherein each first frame has an end that is toward an end of a corresponding second frame and each first frame and each second frame are respectively provided with a recess at said end,
  each absorbing member comprises a shaft having a first end and a second end, a first bushing provided inside the first frame at said end of the first frame, and a second bushing provided inside the second frame at said end of the second frame,
  and the first and second ends of the shaft are disposed in the first and second bushings respectively.

2. The automatic soldering apparatus according to claim 1, wherein the heat treatment portion is provided with heater parts that heat the circuit board;
  the solder processing portion is provided with a solder bath in which the solder is adhered to the circuit board heated by the heater parts;
  the first frames are provided with the heater parts and the second frames are provided with the solder bath.

3. The automatic soldering apparatus according to claim 2, wherein the first and second frames are provided with a pair of reinforcement frames that reinforce the first and second frames.

4. A conveying device wherein when a system which performs a first heat treatment on a conveyed object is set as a first heat treatment system and a system which performs a second heat treatment on the conveyed object on which the first heat treatment is performed by the first heat treatment system is set as a second heat treatment system, the device is provided with:

plural conveying hooks that hold the conveyed object therebetween, conveying chains, each being provided with the conveying hooks, which drive so that the conveying hooks holding the circuit board therebetween are movable from the first heat treatment system to the second heat treatment system, a pair of first frames that have a first sliding portion and guide the conveying chains slid by the first sliding portion along the first heat treatment system;

a pair of second frames that have a second sliding portion that slides the conveying chains continuously transferred from the first sliding portion, are continuously provided to the first sliding portion and guide the conveying chains slid by the second sliding portion along the second heat treatment system; and an absorbing member that is provided between each of the first frames and each of the second frames and absorbs an expansion and contraction based on difference of any thermal expansion between the first and second frames and the conveying chains chains, and wherein each first frame has an end that is toward an end of a corresponding second frame and each first frame and each second frame is provided with a recess at said end, each absorbing member comprises a shaft having a first end and a second end, a first bushing provided inside the first frame at said end of the first frame, and a second bushing provided inside the second frame at said end of the second frame, and the first and second ends of the shaft are disposed in the first and second bushings respectively.

5. The automatic soldering apparatus according to claim 1, wherein the first and second frames are provided with a pair of reinforcement frames that reinforce the first and second frames.

* * * * *

UNITED STATES PATENT AND TRADEMARK OFFICE
CERTIFICATE OF CORRECTION

PATENT NO. : 8,186,563 B2  
APPLICATION NO. : 13/146193  
DATED : May 29, 2012  
INVENTOR(S) : Takashi Sugihara It is certified that error appears in the above-identified patent and that said Letters Patent is hereby corrected as shown below:

Column 12, line 40 (claim 1, line 30) "chains chains," should be --chains,--

Column 14, line 3 (claim 4, line 28) "chains chains," should be --chains,--

Signed and Sealed this  
Seventh Day of August, 2012

David J. Kappos  
*Director of the United States Patent and Trademark Office*